(12) United States Patent
Chang et al.

(10) Patent No.: US 10,112,822 B2
(45) Date of Patent: Oct. 30, 2018

(54) SEMICONDUCTOR DEVICE

(71) Applicant: TAIWAN SEMICONDUCTOR MANUFACTURING CO., LTD., Hsinchu (TW)

(72) Inventors: Kai-Fung Chang, Taipei (TW); Lien-Yao Tsai, Hsinchu (TW); Len-Yi Leu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 15/434,242

(22) Filed: Feb. 16, 2017

(65) Prior Publication Data

US 2018/0230001 A1    Aug. 16, 2018

(51) Int. Cl.
*B81B 3/00*  (2006.01)
*B81C 1/00*  (2006.01)

(52) U.S. Cl.
CPC .......... *B81B 3/0005* (2013.01); *B81C 1/0092* (2013.01); *B81C 1/00269* (2013.01); *B81C 1/00912* (2013.01); *B81C 1/00952* (2013.01); *B81C 1/00984* (2013.01); *B81B 2207/095* (2013.01); *B81C 2201/013* (2013.01); *B81C 2201/0149* (2013.01); *B81C 2203/019* (2013.01); *B81C 2203/035* (2013.01)

(58) Field of Classification Search
CPC ............ B81C 1/00269; B81C 1/00912; B81C 1/0092; B81C 1/00952; B81C 1/0096; B81C 1/00992; B81C 2201/11; B81C 2201/112; B81B 3/0005; B81B 3/0013
See application file for complete search history.

(56) References Cited

U.S. PATENT DOCUMENTS

2006/0246631 A1 * 11/2006 Lutz ...................... B81B 3/0005
                                                              438/127
2010/0085622 A1 *  4/2010 Hofmann ............ B81C 1/00166
                                                              359/221.2

* cited by examiner

*Primary Examiner* — Thanhha Pham
(74) *Attorney, Agent, or Firm* — McClure, Qualey & Rodack, LLP

(57) ABSTRACT

A semiconductor device includes a first substrate, a second substrate, an anti-stiction layer and at least one metal layer. The first substrate includes a microelectromechanical systems (MEMS) structure. The second substrate is bonded to the first substrate and disposed over the MEMS structure. The second substrate comprises at least one through hole. The anti-stiction layer is disposed on a surface of the MEMS structure. The at least one metal layer is disposed over the second substrate and covers the at least one through hole of the second substrate.

20 Claims, 7 Drawing Sheets

SEMICONDUCTOR DEVICE

BACKGROUND

Microelectromechanical systems (MEMS) structures are often suffered from stiction. To solve the stiction problem, an anti-stiction layer, such as self-assembled monolayer (SAM), may be implemented to coat the MEMS structures. However, the anti-stiction layer affect the sequent bonding process so that the MEMS structures may not be sealed in an enclosed space, which results in difficulty in passing reliability tests of the MEMS structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
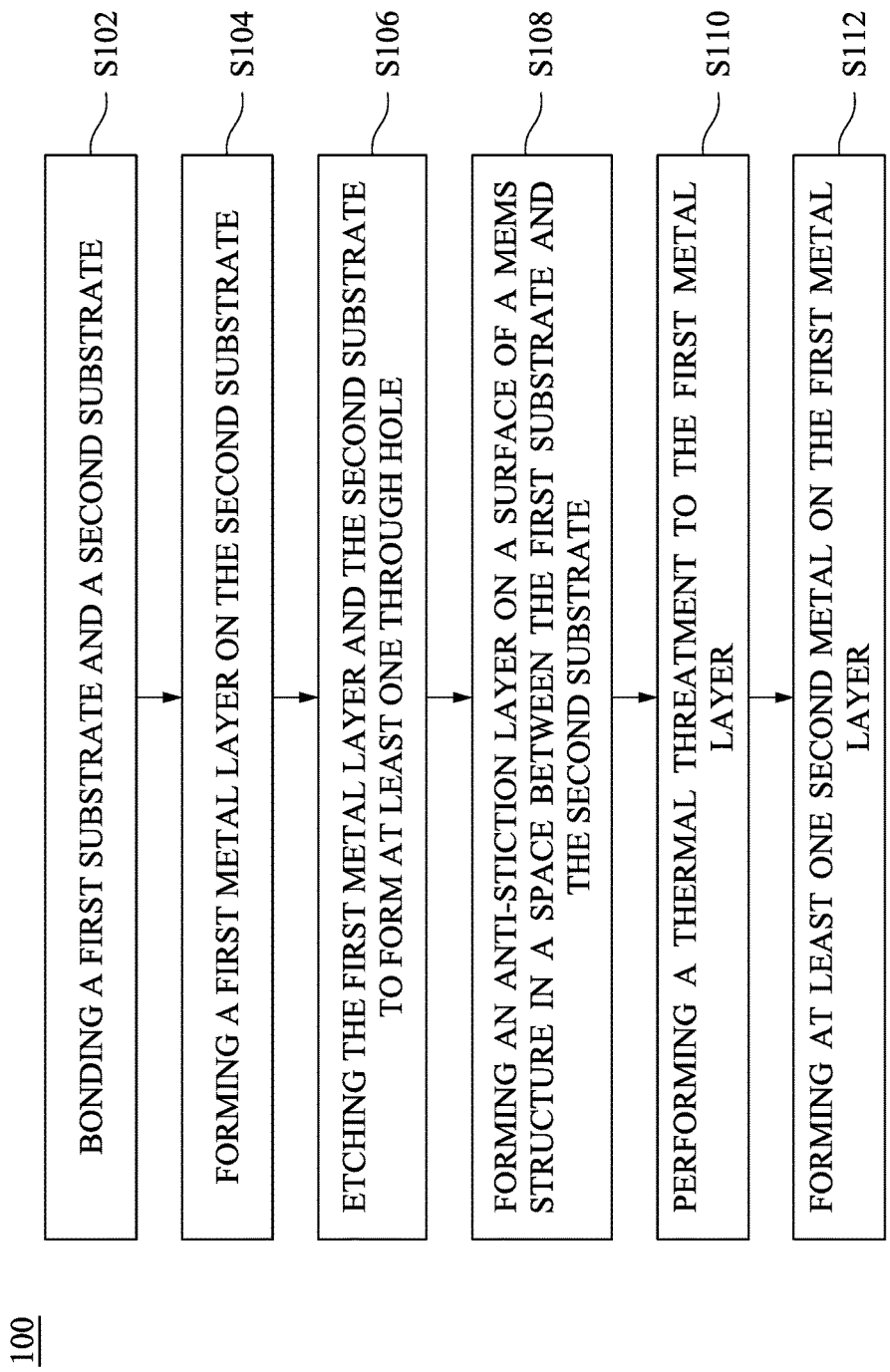
FIG. 1 is a flowchart of a method 100 of manufacturing fins for a semiconductor device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, that is, to mean including but not limited to.

Reference is now made to FIG. 1. FIG. 1 is a flowchart of a method 100 of manufacturing fins for a semiconductor device in accordance with some embodiments of the present disclosure. The method 100 includes operations S102, S104, S106, S108, S110 and S112. These operations are given for illustrative purposes. Additional operations are within the contemplated scoped of the present disclosure. For example, in various embodiments, additional operations are provided before, during, and/or after the operations in the method 100, and/or some of the operations described are replaced or eliminated for other embodiments of the method 100.

Figure 2A:
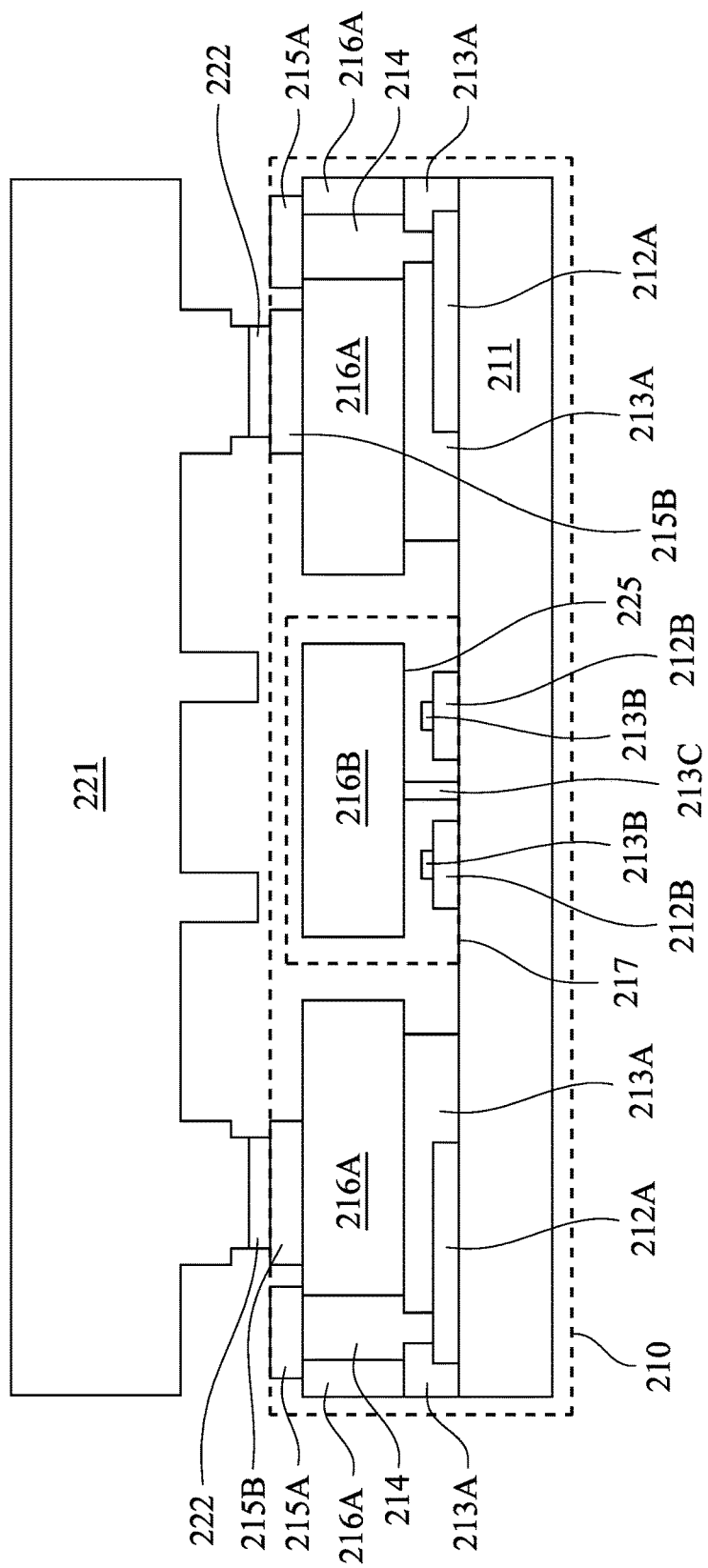
FIGS. 2A-2F are cross-sections of various stages in the manufacture of a semiconductor device, using the method in FIG. 1, in accordance with some embodiments of the present disclosure.

FIGS. 2A-2F are cross-sections of various stages in the manufacture of a semiconductor device 200, using the method in FIG. 1, in accordance with some embodiments of the present disclosure. With respect to the embodiments of FIGS. 2B-2F, like elements in FIG. 2A are designated with the same reference numbers for ease of understanding. For illustration, the method 100 in FIG. 1 is discussed below with reference to FIGS. 2A-2F.

With reference to the method 100 in FIG. 1 and FIG. 2A, in operation S102, a substrate 210 is bonded to a substrate 221, as illustrated in FIG. 2A. In some embodiments, the substrate 210 includes a first eutectic bonding layer 215B, and the substrate 221 includes a second eutectic bonding layer 222. In some embodiments, the first eutectic bonding layer 215B and the second eutectic bonding layer 222 are formed of aluminum (Al), germanium (Ge), copper (Cu), tin (Sn), gold (Au), silicon (Si), or the like, but the present disclosure is not limited thereto.

The materials of the first eutectic bonding layer 215B and the second eutectic bonding layer 222 are selected correspondingly, so that after a eutectic bonding process, the first eutectic bonding layer 215B and the second eutectic bonding layer 222 form an eutectic alloy. In some embodiments, the first eutectic bonding layer 215B is an Al—Cu alloy layer, and the second eutectic bonding layer 222 is a Ge layer. In some embodiments, the first eutectic bonding layer 215B and the second eutectic bonding layer 222 are formed by chemical vapor deposition (CVD), physical vapor deposition (PVD), plating, other suitable process, or combinations thereof. The substrate 210 with the first eutectic bonding layer 215B is bonded to the substrate 221 with the second eutectic bonding layer 222 by using a eutectic bonding, including, for example, aluminum (Al)/ germanium (Ge) bonding, cooper (Cu)/ tin (Sn) bonding, gold (Au)/ tin (Sn) bonding, gold (Au)/ germanium (Ge) bonding, gold (Au)/ tin (Si) bonding, and/or another suitable bonding. After the bonding process, a microelectromechanical systems (MEMS) structure 217 is in a space between the substrate 210 and the substrate 221.

The aforementioned materials used for forming the first eutectic bonding layer 215B and the second eutectic bonding layer 222 are given for illustrative purposes. Various materials of the first eutectic bonding layer 215B and the second eutectic bonding layer 222 are within the contemplated scoped of the present disclosure.

For illustration, a eutectic reaction occurs between the first eutectic bonding layer 215B and the second eutectic bonding layer 222, thereby forming eutectic alloy layer. In some embodiments, the eutectic reaction is achieved by heating the first eutectic bonding layer 215B and second eutectic bonding layer 222 to their eutectic temperature, at which a combination of the first eutectic bonding layer 215B and the second eutectic bonding layer 222 initially forms a eutectic state. In some embodiments, the first eutectic bonding layer 215B and the second eutectic bonding layer 222 are heated to a temperature of about 420° C. to about 440° C. When the first eutectic bonding layer 215B and the second eutectic bonding layer 222 are at their eutectic temperatures, the materials at the interface of the first eutectic bonding layer 215B and the second eutectic bonding layer 222 diffuse together to form an alloy composition (i.e., the eutectic alloy layer) in a liquid phase. More specifically, as the temperature rises yet remains below the eutectic point of the first eutectic bonding layer 215B and the second eutectic bonding layer 222, the first eutectic bonding layer 215B and the second eutectic bonding layer 222 are in a solid state while some inter-diffusion occurs between the first eutectic bonding layer 215B and second eutectic bonding layer 222 at their interface. As the temperature is close to the eutectic point and reaches the eutectic point, the first eutectic bonding layer 215B and the second eutectic bonding layer 222 diffuse together in an alloy phase, thereby forming the eutectic alloy layer (e.g., Al—Ge alloy phase).

The values of the aforementioned eutectic temperature are given for illustrative purposes only. Various values of the eutectic temperature are within the contemplated scope of the present disclosure.

In some embodiments, the semiconductor device 200 or the MEMS structure 217 is implemented as a motion sensor. In some embodiments, the motion sensor is implemented by, for example, a gyroscope or an accelerometer, but the present disclosure is not limited thereto. In alternative embodiments, the semiconductor device 200 or the MEMS structure 217 is a radio frequency (RF) MEMS device (for example, RF switch or filter), an oscillator, a microphone, an optical device, a pressure sensor device, and/or any other MEMS type device, including future MEMS type devices. One of ordinary skill in the art will recognize that the MEMS structure 217 could alternatively include nanoelectromechanical elements, for example, the MEMS structure 217 may alternatively be a nanoelectromechanical system (NEMS) structure.

In some embodiments, the MEMS structure 217 is fabricated using typical processes of a complementary metal-oxide-semiconductor (CMOS) fabrication process, including, for example, photolithography, etching processes, deposition processes, plating processes, and other suitable processes.

In some embodiments, the substrate 210 includes the MEMS structure 217, a substrate 211 (e.g., silicon substrate) with a circuit (e.g., a complementary metal-oxide-semiconductor (CMOS) circuit) (not shown), a substrate 216A (e.g., silicon substrate), vias 214 (e.g., formed of tungsten (W)), and wirings 212A and 215A (e.g., formed of aluminum-cooper (Al—Cu) alloy). The vias 214 and the wirings 212A and 215A are configured to connect the circuit in the substrate to the MEMS structure and/or another circuit. In some embodiments, the vias 214 are through-silicon-vias (TSVs). The MEMS structure 217 includes a main structure 216B (e.g., formed of silicon) that is movable, a connection structure 213C (e.g., formed of silicon dioxide ($SiO_2$)) and anti-stiction structures (e.g., bumps) that are formed by metal layers 212B (e.g., formed of aluminum copper (Al—Cu) alloy) and insulator layers 213B (e.g., formed of silicon dioxide ($SiO_2$)). The main structure 216B of the MEMS structure 217 is connected to the substrate 211 through the connection structure 213C. The aforementioned materials are given for illustrative purposes. Various materials of the substrate 211, the substrate 216A, the vias 214, the wirings 212A and 215A, and the MEMS structure 217 are within the contemplated scoped of the present disclosure.

In some embodiments, the substrate 210 is formed by fusion-bonding the substrate 211 and the substrate 216A. Various processes of forming the substrate 210 are within the contemplated scoped of the present disclosure.

It is understood that the substrates 211, 216A and 221 may comprise the same or different materials and may comprise any suitable combination of materials. For example, in some embodiments, the substrates 211, 216A and 221 are each a semiconductor substrate that includes an elementary semiconductor including silicon and/or germanium; a compound semiconductor including silicon carbide, gallium arsenic (GeAs), gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Furthermore, the substrate may be a semiconductor on insulator (SOI). In some examples, the substrate may include a doped epi layer. In other examples, the silicon substrate may include a multilayer compound semiconductor structure. Alternatively, the substrates may include a non-semiconductor material, such as a glass, fused quartz, or calcium fluoride.

Figure 2B:
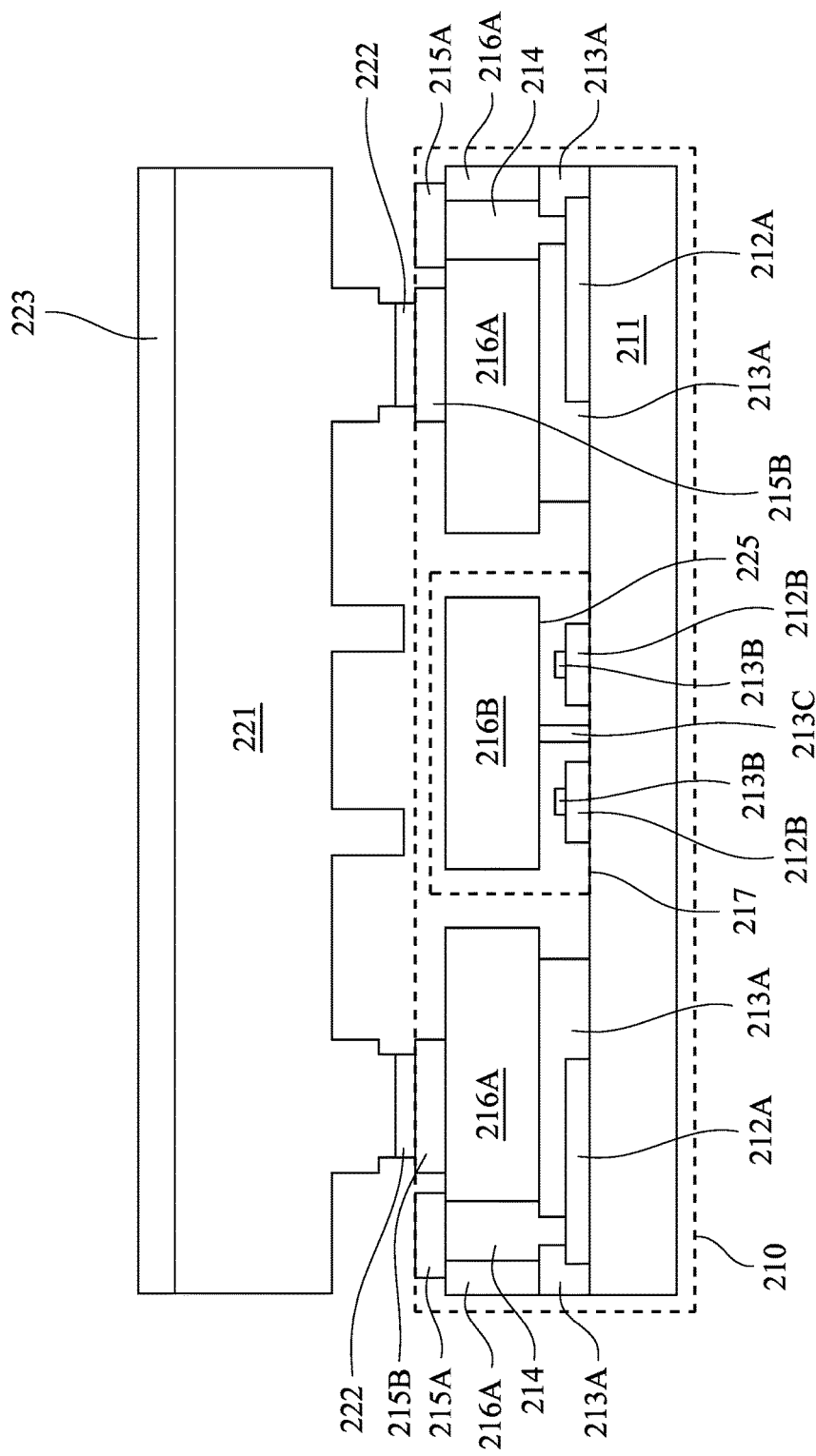

With reference to the method 100 in FIG. 1 and FIG. 2B, in operation S104, subsequently, a metal layer 223 is formed on the substrate 221, as illustrated in FIG. 2B. In some embodiments, the metal layer 223 is formed by a deposition process and formed of Al—Cu alloy or the like, but the present disclosure is not limited thereto. The aforementioned materials are given for illustrative purposes. Various materials of the metal layer 223 are within the contemplated scoped of the present disclosure.

Figure 2C:
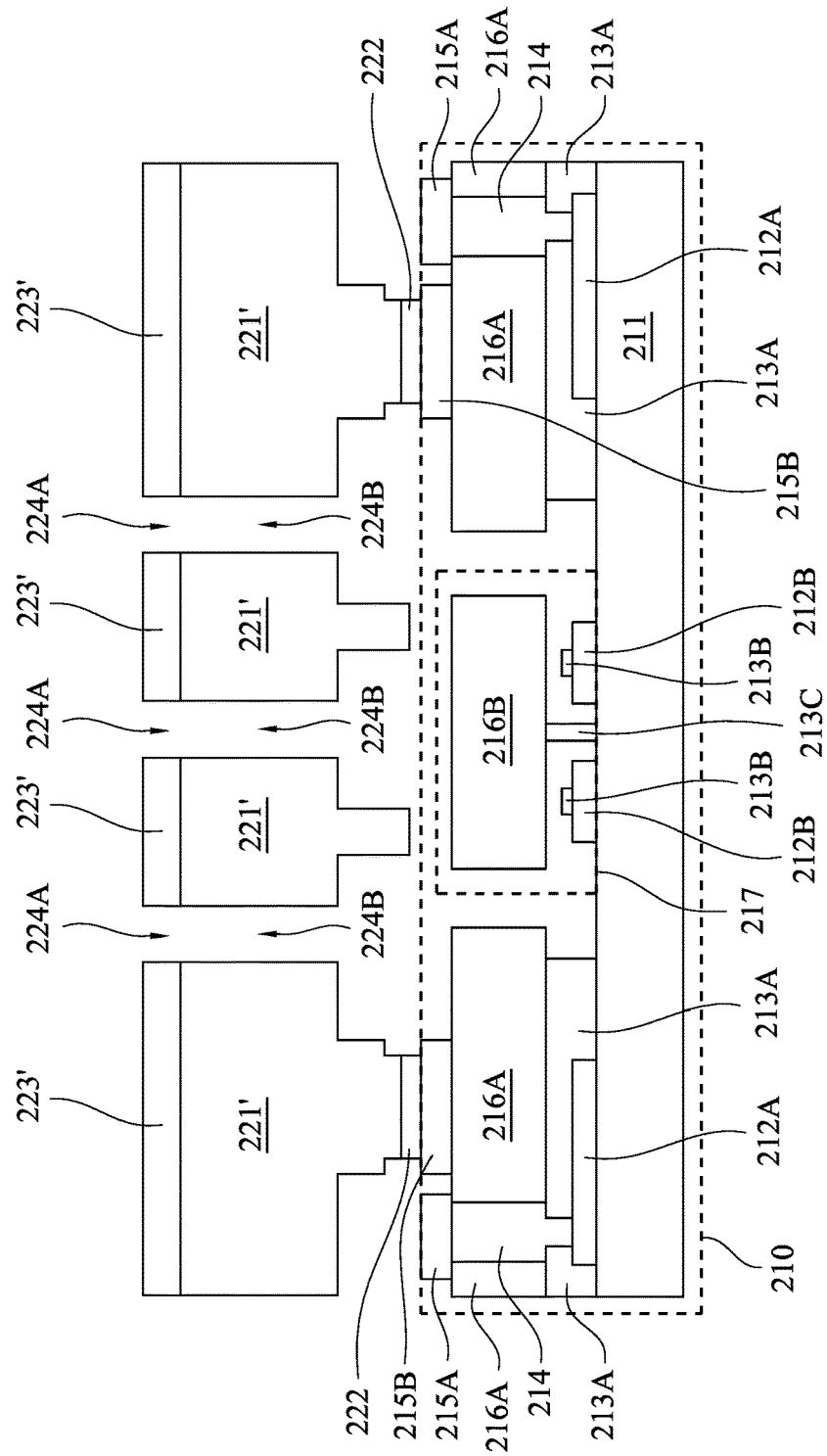

Next, with reference to the method 100 in FIG. 1 and FIG. 2C, in operation S106, the metal layer 223 in FIG. 2B is etched to form a metal layer 223', and the substrate 221 is etched to form a substrate 221', as illustrated in FIG. 2C. The formation of the etched metal layers 223 includes patterning the metal layer 223 as illustrated in FIG. 2B, for example, using a combination of photolithography and etching processes. As illustratively shown in FIG. 2C, the metal layer 223' includes through holes 224A, and the substrate 221' includes through holes 224B. The through holes 224A of the metal layer 223' is corresponding to the through holes 224B of the substrate 221'. In some embodiments, widths of the through holes 224A and the through holes 224B are about 0.5 microns ($\mu m$) to about 50 microns ($\mu m$). The values of the widths of the through holes 224A and the through holes 224B are given for illustrative purposes only. Various values of the widths of the through holes 224A and the least one through hole 224B are within the contemplated scope of the present disclosure.

The values of the numbers of the through holes 224A and the through holes 224B are given for illustrative purposes only. Various values of the numbers of the through holes 224A and the least one through holes 224B are within the contemplated scope of the present disclosure. In some embodiments, the number of the through holes 224A is 1. In some other embodiments, the number of the through holes 224B is 1.

Figure 2D:
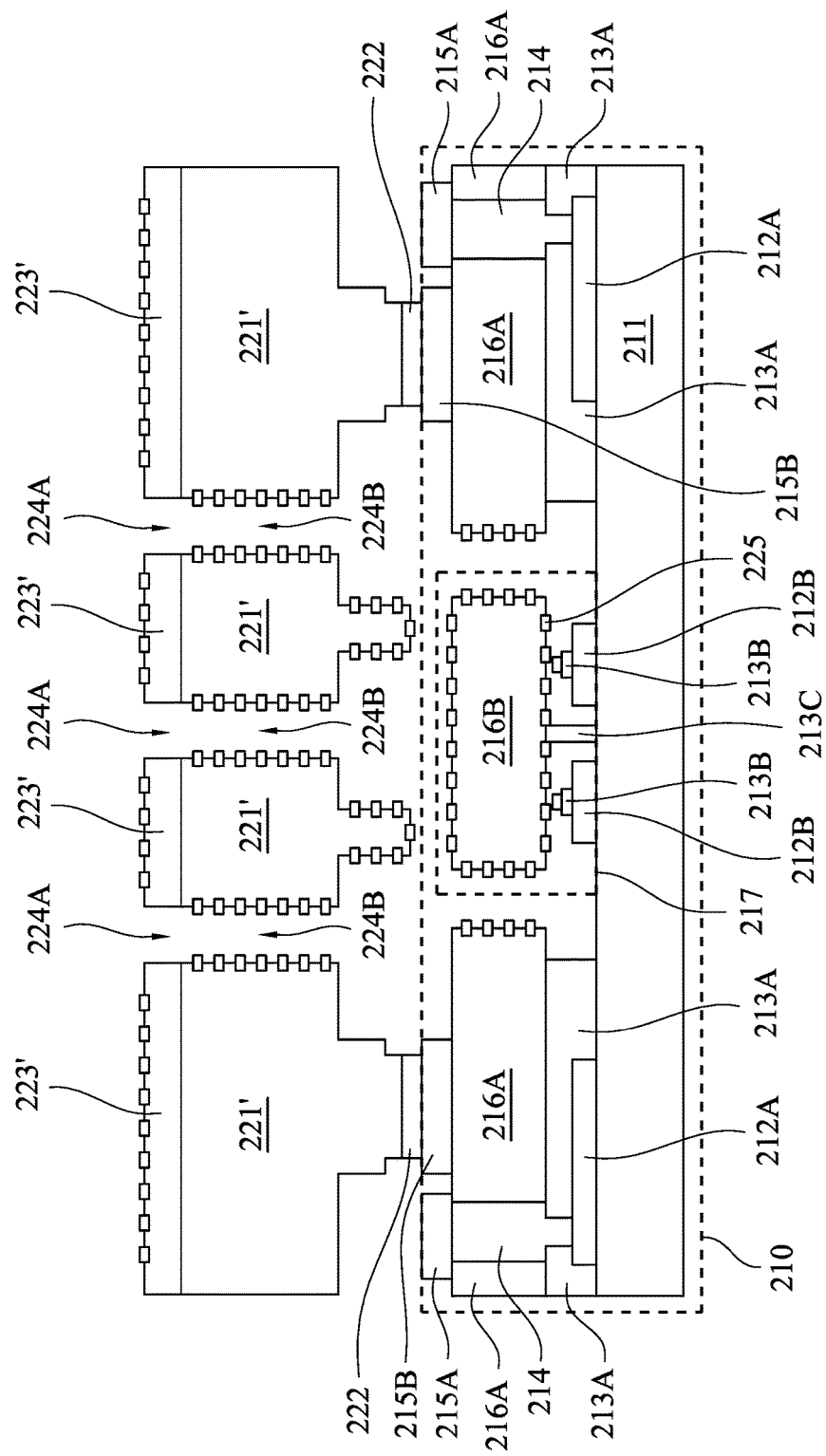

With reference to the method 100 in FIG. 1 and FIG. 2D, in operation S108, an anti-stiction layer 225 is formed on a surface of the MEMS structure 217, as illustrated in FIG. 2D. After the formation of the through holes 224A and the through holes 224B, vapor molecules are able to enter the space between the substrate 210 and the substrate 221, and attached to the surface of the MEMS structure 217 to form the anti-stiction layer 225. In the depicted embodiment, the anti-stiction layer 225 is formed by a molecular vapor deposition (MVD) process or other suitable process. Every surface exposed to the gas molecules during the molecular vapor deposition (MVD) process is covered with the anti-stiction layer 225, including, for example, a surface of the metal layer 223', surfaces of the through holes 224A and the through holes 224B, a surface surrounding the space between the substrate 210 and the substrate 221.

The anti-stiction layer 225 interacts differently with the metal layer 223' and the MEMS structure 217. In the depicted embodiment, since the MEMS structure 217, for example, the main structure 216B, includes silicon-based material, the anti-stiction layer 225 interacts with the MEMS structure 217 to form Si—Si bonds between the anti-stiction layer 225 and the MEMS structure 217. In some embodiments, when the anti-stiction layer 225 includes silane molecules, hydroxylation of the silane molecules can produce hydroxylized silanes that attach to the silicon-based MEMS structure 217. For example, covalent bonds may form between the anti-stiction layer 225 and the MEMS structure 217 when the hydroxylized silanes attach to OH groups of the silicon-based MEMS structure 217. Such attachment can generate the anti-stiction layer 225 that is a thin Teflon-like film, which can exhibit low surface energy. Further, in the depicted embodiment, since the metal layer 223' includes metal-based material, the anti-stiction layer 225 reacts with the metal layer 223' to form Si-metal bonds.

In some embodiments, the anti-stiction layer 225 is formed of an organic based material. The anti-stiction layer 225 on the surface of the MEMS structure 217 is formed by coating a self-assembling monolayer (SAM). The self-assembling monolayer (SAM) may include silane molecules and alky-chains, or fluorinated alky-chains. For example, the self-assembling monolayer (SAM) is formed of perfluorodecyltrichlorosilane (FDTS), octadecyltrichlorosilane (OTS), dimethyldichlorosilane (DDMS), or fluoro-octyltrichloro-silane (FOTS), but the present disclosure is not limited thereto. A thickness of the self-assembling monolayer (SAM) is about 10 angstroms (Å) to about 30 angstroms (Å), which depends on the selected material of the self-assembling monolayer (SAM). Alternatively, the anti-stiction layer 225 includes another suitable material. The aforementioned materials are given for illustrative purposes. Various materials of the anti-stiction layer 225 are within the contemplated scoped of the present disclosure.

Figure 2E:
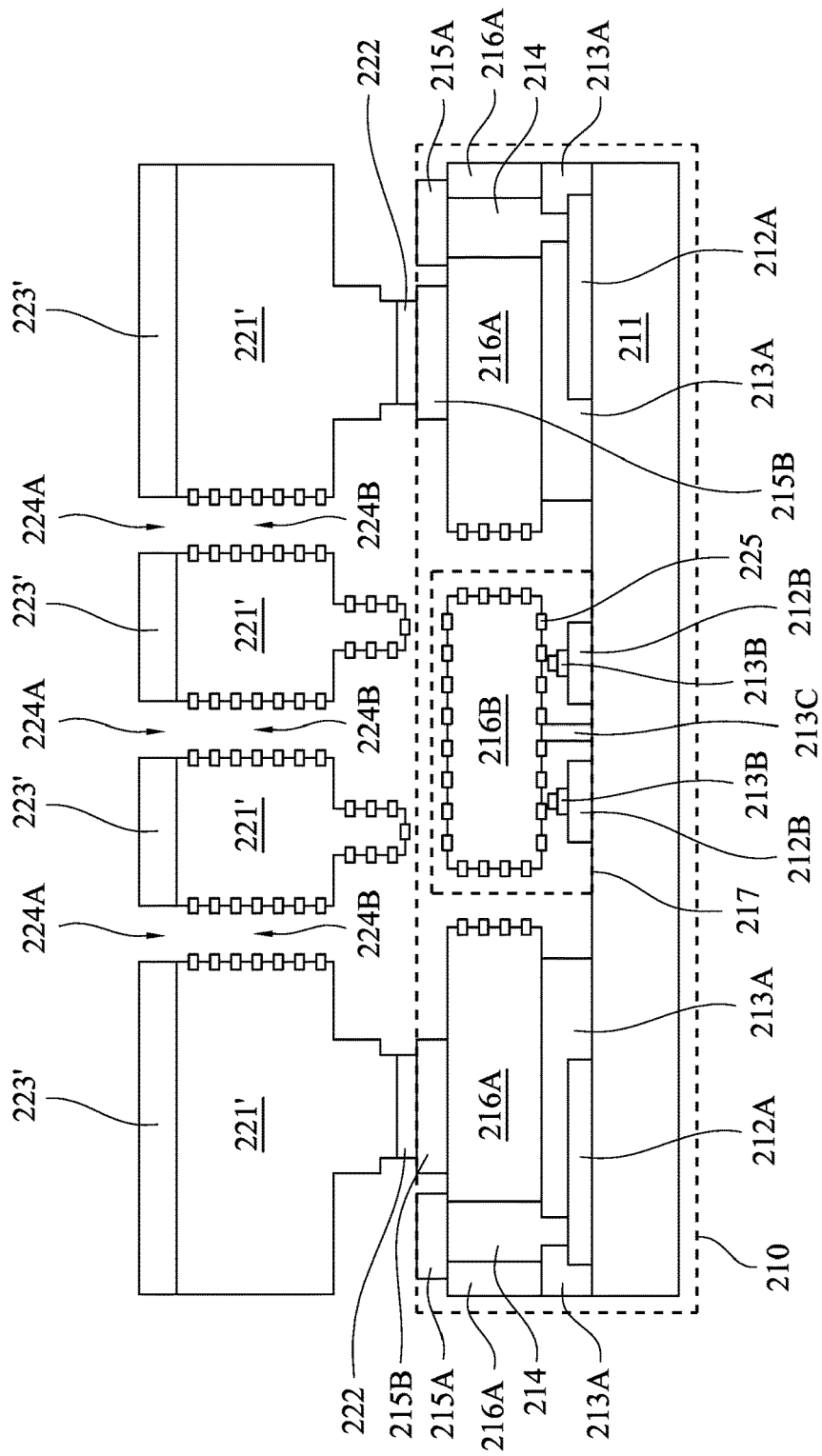

With reference to the method 100 in FIG. 1 and FIG. 2E, in operation S110, subsequently, a thermal treatment, such as a thermal baking process, is performed to the semiconductor structure, as illustrated in FIG. 2E. The thermal treatment may be performed in a furnace, an oven, a chemical vapor deposition (CVD) chamber, or any other heating apparatus.

The thermal treatment is performed to break down bonds between the anti-stiction layer 225 and the metal layer 223' faster than bonds between the anti-stiction layer 225 and the MEMS structure 217. Because the Si—Si bonds between the anti-stiction layer 225 and the MEMS structure 217 are stronger than the Si-metal bonds between the anti-stiction layer 225 and the metal layer 223'. In other words, a bonding energy between the anti-stiction layer 225 and the MEMS structure 217 is greater than a bonding energy between the anti-stiction layer 225 and the metal layer 223'. Because of the bonds between the anti-stiction layer 225 and the metal layer 223' are different from the bonds between the anti-stiction layer 225 and the MEMS structure 217, a thermal treatment process parameter for the thermal treatment may be used to selectively remove the anti-stiction layer 225 from the metal layer 223', while preserving the anti-stiction layer 225 on the surface of the MEMS structure 217. After the thermal treatment in operation S110, the anti-stiction layer 225 on the metal layer 223' is selectively removed because bonds between the anti-stiction layer 225 and the metal layer 223' are broken, while the anti-stiction layer 225 on the MEMS structure 217 is preserved. In some embodiments, temperature of the thermal treatment is about 200° C. to about 500° C. The values of the temperature of the thermal treatment are given for illustrative purposes only. Various values of the temperature of the thermal treatment are within the contemplated scope of the present disclosure.

Figure 2F:
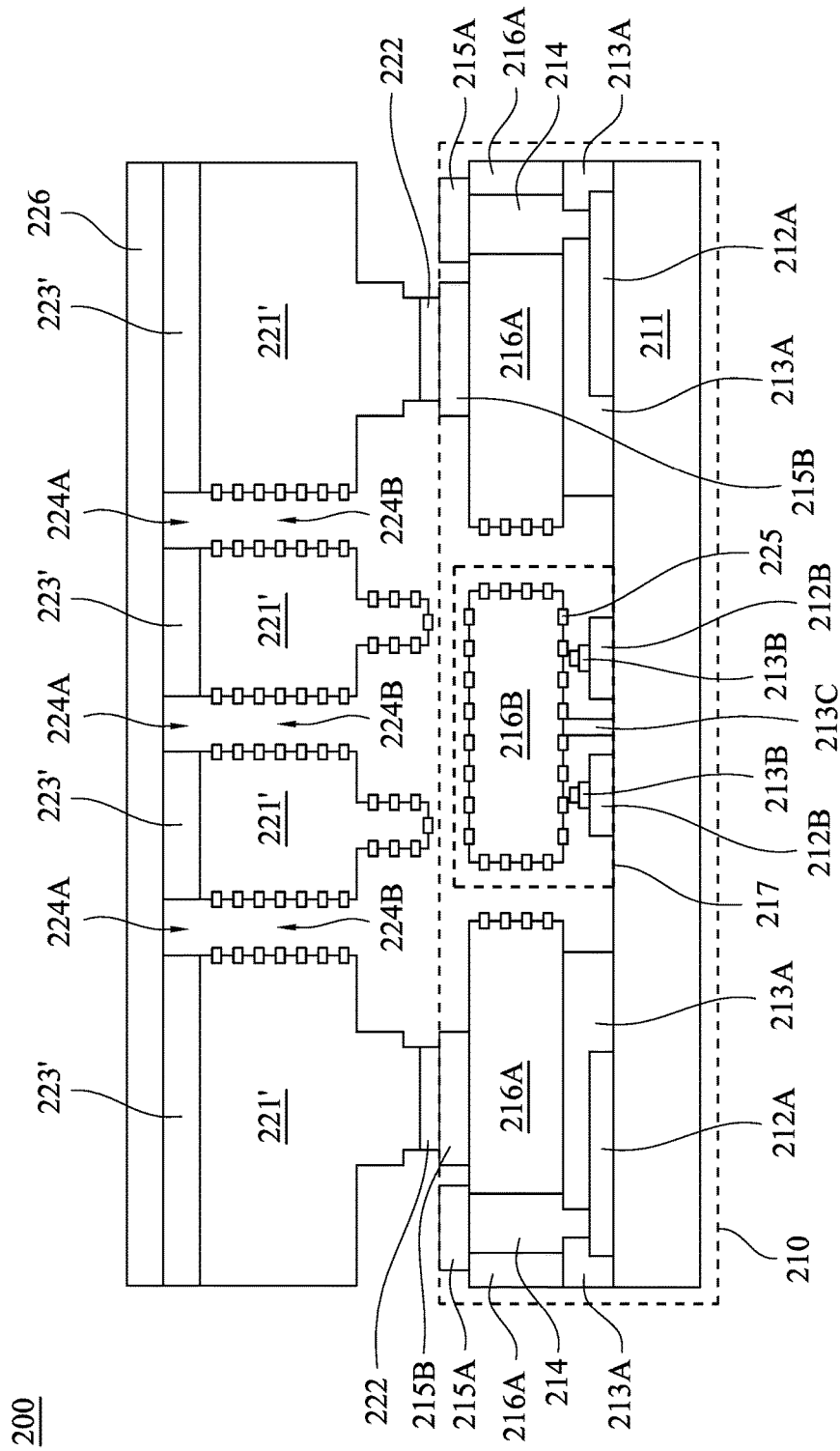

Next, with reference to the method 100 in FIG. 1 and FIG. 2F, in operation S112, metal layer 226 is formed on the metal layer 223' and cover the through holes 224A of the metal layer 223' and the through holes 224B of the substrate 221', as illustrated in FIG. 2F. In some embodiments, the metal layer 226 is formed by a deposition process and formed of titanium (Ti), aluminum copper (Al—Cu) alloy, titanium nitride (TiN), or a combination thereof, but the present disclosure is not limited thereto. In other words, the metal layer 226 may include a multilayer structure. For example, the metal layer 226 may include a Ti layer, an Al—Cu alloy layer and a TiN layer structure. A total thickness of the metal layer 226 is larger than the width of the through holes 224A in order to seal (e.g., hermetically seal) the through holes 224A. For illustration, the total thickness of the metal layer 226 is about 0.5 microns (μm) to about 200 microns (μm). The values of the total thickness of the metal layer 226 are given for illustrative purposes only. Various values of the total thickness of the metal layer 226 are within the contemplated scope of the present disclosure. The aforementioned materials are given for illustrative purposes. Various materials of the metal layer 226 are within the contemplated scoped of the present disclosure.

After the metal layer 226 is formed, the MEMS structure 217 is in an enclosed space between the substrate 210 and the substrate 221, and a semiconductor device 200 is formed. In such embodiments, the semiconductor device 200 includes the substrate 210 that includes the MEMS structure 217, the substrate 221, the anti-stiction layer 225 disposed on the surface of the MEMS structure 217, and the metal layer 226 disposed over the substrate 221.

In some approaches, a self-assembling monolayer (SAM) coating process is performed to a MEMS structure to prevent stiction. However, because of the self-assembling monolayer (SAM), a sequent substrate bonding process to seal the MEMS structure is easily failed.

Compared to the aforementioned approaches, the present disclosure performs the formation of the anti-stiction layer 225 after bonding the substrate 210 and the substrate 221. Therefore, the MEMS structure 217 with the anti-stiction layer 225 is successfully sealed in the enclosed space by bonding the substrate 210 and the substrate 221, and the MEMS structure is free from stiction during operation.

The above description of the method 100 includes exemplary operations, but the operations of the method 100 are not necessarily performed in the order described. The order of the operations of the method 100 disclosed in the present disclosure are able to be changed, or the operations are able to be executed simultaneously or partially simultaneously as appropriate, in accordance with the spirit and scope of various embodiments of the present disclosure.

In some embodiments, the semiconductor device 200 further includes the metal layer 223' and the metal layer 226. The metal layer 223' is formed on the substrate 221'. The metal layer 226 is formed above the metal layer 223' and covers the through holes 224B of the substrate 221'.

In some other embodiments, the semiconductor device 200 further includes the metal layer 223' and the metal layer 226. The metal layer 223' includes the through holes 224A. The through holes 224A are corresponding to the through holes 224B of the substrate 221'. The metal layer 226 is disposed on the metal layer 223' and covers the through holes 224A of the metal layer 223' and the through holes 224B of the substrate 221'.

In various embodiments, for illustration in FIG. 2B and FIG. 2C, the MEMS structure 217, the substrate 210 and the substrate 221 are included in a semiconductor structure (not labeled). In some embodiments, the semiconductor structure is formed by eutectically bonding the substrate 210 and the substrate 221 and forming the metal layer 223 on the substrate 221. The semiconductor structure is etched to form the through holes 224A and the through holes 224B. The metal layer 223 as illustrated in FIG. 2B is etched to form the through holes 224A and the etched metal layer 223' as illustrated in FIG. 2C. A subsequent etching process is performed to the substrate 221 as illustrated in FIG. 2B to form the through holes 224B and the etched substrate 221' as illustrated in FIG. 2C.

Next, for illustration in FIG. 2D, during the molecular vapor deposition (MVD) process, vapor molecules to form the anti-stiction layer 225 (e.g., the self-assembling monolayer (SAM)) are able to reach every surface exposed to the vapor, including the surface of the MEMS structure 217, by passing through the through holes 224A and the through holes 224B. In some embodiments, the vapor molecules are perfluorodecyltrichlorosilane (FDTS), octadecyltrichlorosilane (OTS), dimethyldichlorosilane (DDMS), or fluoro-octyl-trichloro-silane (FOTS), but the present disclosure is not limited thereto. Alternatively, the anti-stiction layer 225 includes another suitable material. In the depicted embodiment, the anti-stiction layer 225 is formed by a molecular vapor deposition (MVD) process or other suitable process.

For illustration in FIG. 2F, the at least one through hole of the semiconductor structure is sealed to form the semiconductor device 200 with the MEMS structure 217 in the enclosed space. In some embodiments, the metal layer 226 is form on the etched metal layer 223' to seal (e.g., hermetically seal) the through holes 224A. Because the surface of the etched metal layer 223' is also covered with the anti-stiction layer 225 as illustrated in FIG. 2D, the anti-stiction layer 225 on the surface of the etched metal layer 223' is necessary to be removed before the metal layer 226 is formed on the etched metal layer 223'. In some embodiments, the thermal treatment is performed to selectively remove the anti-stiction layer 225 on the etched metal layer 223' as illustrated in FIG. 2E. Subsequently, the metal layer 226 is formed on the surface of the etched metal layer 223' without the anti-stiction layer 225 to seal the through holes 224A.

Based on the above embodiment, with the eutectically bonding process and the sequent anti-stiction layer formation process, the MEMS structure 217 of the present disclosure can move in the enclosed space formed by bonding the substrate 210 and the substrate 221 without stiction. Without an effect of the anti-stiction layer 225 on the surfaces for eutectically bonding, eutectic bonds between the substrate 210 and the substrate 221 is strong enough to form the enclosed space that passes reliability test.

In some embodiments, a semiconductor device is disclosed that includes a first substrate, a second substrate, an anti-stiction layer and at least one metal layer. The first substrate includes a microelectromechanical systems (MEMS) structure. The second substrate is bonded to the first substrate and disposed over the MEMS structure. The second substrate comprises at least one through hole. The anti-stiction layer is disposed on a surface of the MEMS structure. The at least one metal layer is disposed over the second substrate and covers the at least one through hole of the second substrate.

Also disclosed is a method that includes the operations below. A first substrate is bonded to a second substrate. A microelectromechanical systems (MEMS) structure is in a space between the first substrate and the second substrate. The second substrate is etched to form at least one through hole. An anti-stiction layer is formed on a surface of the MEMS structure. The at least one through hole of the second substrate is sealed.

Also disclosed is a method that includes the operations below. A semiconductor structure is etched to form at least one through hole. The semiconductor structure includes a microelectromechanical systems (MEMS) structure, a first substrate, and a second substrate that is eutectically bonded to the first substrate. An anti-stiction layer is formed on a surface of the MEMS structure. The at least one through hole of the semiconductor structure is sealed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   bonding a first substrate to a second substrate, wherein a microelectromechanical systems (MEMS) structure is in a space between the first substrate and the second substrate;
   etching the second substrate to form at least one through hole;
   forming a first metal layer over the second substrate;
   forming an anti-stiction layer on a surface of the MEMS structure and the first metal layer;
   removing the anti-stiction layer from the first metal layer by performing a thermal treatment to the first metal layer; and sealing the at least one through hole of the second substrate.

2. The method of claim 1, wherein bonding the first substrate to the second substrate comprises:
eutectically bonding the first substrate to the second substrate.

3. The method of claim 1, wherein forming the anti-stiction layer on the surface of the MEMS structure comprises:
coating a self-assembling monolayer (SAM) on the surface of the MEMS structure.

4. The method of claim 3, wherein the SAM comprises one of perfluorodecyltrichlorosilane (FDTS), octadecyltrichlorosilane (OTS), dimethyldichlorosilane (DDMS) and fluoro-octyl-trichloro-silane (FOTS).

5. The method of claim 1, further comprising:
etching the first metal layer to form at least one through hole corresponding to the at least one through hole of the second substrate.

6. The method of claim 5, wherein sealing the at least one through hole of the second substrate comprises:
forming at least one second metal layer on the first metal layer to seal the at least one through hole of the first metal layer and the at least one through hole of the second substrate.

7. The method of claim 6, wherein
the thermal treatment to the first metal layer is performed before the at least one second metal layer is formed.

8. The method of claim 6, wherein the at least one second metal layer comprises Ti, Al—Cu alloy, TiN, or a combination thereof.

9. A method, comprising:
etching a semiconductor structure to form at least one through hole, wherein the semiconductor structure comprises a microelectromechanical systems (MEMS) structure, a first substrate, and a second substrate that is eutectically bonded to the first substrate, wherein etching the semiconductor structure comprises etching a first metal layer that is disposed over the second substrate;
forming an anti-stiction layer on a surface of the MEMS structure and the first metal layer;
removing the anti-stiction layer from the first metal layer by performing a thermal treatment to the etched first metal layer; and
sealing the at least one through hole of the semiconductor structure.

10. The method of claim 9, wherein forming the anti-stiction layer on the surface of the MEMS structure comprises:
coating a self-assembling monolayer (SAM) on the surface of the MEMS structure by a molecular vapor deposition (MVD) process.

11. The method of claim 10, wherein the SAM comprises one of perfluorodecyltrichlorosilane (FDTS), octadecyltrichlorosilane (OTS), dimethyldichlorosilane (DDMS) and fluoro-octyl-trichloro-silane (FOTS).

12. The method of claim 9, wherein etching the semiconductor structure further comprises:
etching the second substrate, to form the at least one through hole.

13. The method of claim 12, wherein sealing the at least one through hole comprises:
forming at least one second metal layer on the etched first metal layer to seal the at least one through hole.

14. The method of claim 13, wherein
the thermal treatment to the first metal layer is performed before the at least one second metal layer is formed.

15. A method, comprising:
forming an anti-stiction layer on a surface of a microelectromechanical systems (MEMS) structure via at least one through hole of a semiconductor structure, and on a first metal layer that is disposed over the semiconductor structure; wherein the MEMS structure is located in the semiconductor structure;
removing the anti-stiction layer from the first metal layer by performing a thermal treatment to the semiconductor structure; and
forming at least one metal layer to seal the at least one through hole of the semiconductor structure.

16. The method of claim 15, wherein forming the anti-stiction layer on the surface of the MEMS structure comprises:
coating a self-assembling monolayer (SAM) on the surface of the MEMS structure by a molecular vapor deposition (MVD) process.

17. The method of claim 16, wherein the SAM comprises one of perfluorodecyltrichlorosilane (FDTS), octadecyltrichlorosilane (OTS), dimethyldichlorosilane (DDMS) and fluoro-octyl-trichloro-silane (FOTS).

18. The method of claim 15, wherein the semiconductor structure further comprises a first substrate and a second substrate, the at least one through hole is formed at the second substrate, the MEMS structure is located between the first substrate and the second substrate, and the method further comprises:
eutectically bonding the first substrate and the second substrate.

19. The method of claim 15, wherein the at least one metal layer comprises titanium (Ti), aluminum copper (Al—Cu) alloy, titanium nitride (TiN), or a combination thereof.

20. The method of claim 15, wherein
the thermal treatment to the first metal layer is performed before the at least one metal layer is formed.

* * * * *